US006377930B1

(12) United States Patent
Chen et al.

(10) Patent No.: US 6,377,930 B1
(45) Date of Patent: Apr. 23, 2002

(54) VARIABLE TO VARIABLE LENGTH ENTROPY ENCODING

(75) Inventors: Wei-ge Chen, Issaquah; Ming-Chieh Lee, Bellevue, both of WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/211,294

(22) Filed: Dec. 14, 1998

(51) Int. Cl.[7] .......................... G10L 19/00; H03M 7/46
(52) U.S. Cl. ......................... 704/503; 704/504; 341/63
(58) Field of Search ............................... 704/503, 504; 341/106, 107, 51, 63, 67

(56) References Cited

U.S. PATENT DOCUMENTS

| 4,122,440 A | * | 10/1978 | Langdon, Jr. et al. ......... 341/51 |
| 4,464,650 A | | 8/1984 | Eastman et al. |
| 4,558,302 A | | 12/1985 | Welch |
| 4,706,265 A | | 11/1987 | Furukawa |
| 4,744,085 A | | 5/1988 | Fukatsu |
| 5,003,307 A | | 3/1991 | Whiting et al. |
| 5,227,788 A | * | 7/1993 | Johnston et al. ............... 341/63 |
| 5,229,768 A | * | 7/1993 | Thomas ......................... 341/51 |
| 5,254,990 A | | 10/1993 | Yoshida |
| 5,406,279 A | * | 4/1995 | Anderson et al. ............. 341/51 |
| 5,442,350 A | | 8/1995 | Iyer et al. |
| 5,479,562 A | | 12/1995 | Fielder et al. |
| 5,530,866 A | * | 6/1996 | Koblenz et al. ............ 395/700 |
| 5,532,694 A | | 7/1996 | Mayers et al. |
| 5,534,861 A | | 7/1996 | Chang et al. |
| 5,550,541 A | | 8/1996 | Todd |
| 5,579,430 A | | 11/1996 | Grill et al. |
| 5,623,262 A | * | 4/1997 | Normile et al. ............... 341/67 |
| 5,644,305 A | | 7/1997 | Inoue et al. |
| 5,790,706 A | | 8/1998 | Auyeung |
| 5,819,215 A | * | 10/1998 | Dobson et al. ............. 704/230 |
| 5,825,830 A | | 10/1998 | Kopf |

(List continued on next page.)

FOREIGN PATENT DOCUMENTS

| EP | 0283735 A2 | 9/1988 |
| EP | 0462363 A2 | 12/1991 |
| EP | 0535571 A2 | 4/1993 |
| EP | 0612156 A2 | 4/1994 |
| JP | 62247626 | 10/1987 |
| JP | 09232968 | 9/1997 |
| WO | WO 98/40969 | 9/1998 |

OTHER PUBLICATIONS

Bell et al., Text Compression, "Contents," "Preface," "Chapter 8: Dictionary Techniques," "Chapter 9: Dictionary Versus Statistical Coding,"to "References, " Prentice Hall Advance Reference Series, pp. v–xi, xiii–xviii, 206–243, 244–273, 303–310 (1990).

De Agostino et al., "Parallel Algorithms for Optimal Compression using Dictionaries with the Prefix Property," in Proc. Data Compression Conference '92, IEEE Computer Society Press, pp. 52–62 (1992).

ISO/IEC 13818–7: Information Technology—Generic coding of moving pictures and associated audio information—Part 7: Advanced Audio Coding, pp. I–vi, 1–147 (1997).

(List continued on next page.)

Primary Examiner—Richemond Dorvil
Assistant Examiner—Susan McFadden
(74) Attorney, Agent, or Firm—Klarquist Sparkman, LLP

(57) ABSTRACT

Entropy encoding and decoding of data with a code book containing variable length entropy-type codes that are assigned to variable length input symbol groupings. The variable length input sequences are identified by scanning an input channel, such as a live broadcast, non-volatile data storage, or network connection (e.g., LAN, WAN, Internet). Each time a symbol grouping is recognized, a corresponding entropy-type code is output as a replacement for the input stream. Decoding is the inverse process of encoding, where a code word is looked up in the code book and the corresponding original input is obtained.

25 Claims, 7 Drawing Sheets

U.S. PATENT DOCUMENTS

| | | | |
|---|---|---|---|
| 5,831,559 A | | 11/1998 | Agarwal et al. |
| 5,845,243 A | * | 12/1998 | Smart et al. ................ 704/230 |
| 5,872,530 A | | 2/1999 | Domyo et al. |
| 5,883,589 A | | 3/1999 | Takashima et al. |
| 5,884,269 A | | 3/1999 | Cellier et al. |
| 5,907,637 A | | 5/1999 | Murashita |
| 5,933,104 A | | 8/1999 | Kimura |
| 5,959,560 A | | 9/1999 | Said et al. |
| 5,995,118 A | | 11/1999 | Masuda |
| 6,029,126 A | | 2/2000 | Malvar |
| 6,047,298 A | | 4/2000 | Morishita |
| 6,052,150 A | | 4/2000 | Kikuchi |
| 6,100,824 A | | 8/2000 | MacLeod et al. |
| 6,223,162 B1 | * | 4/2001 | Chen et al. ................. 704/503 |
| 6,300,888 B1 | * | 10/2001 | Chen et al. .................... 341/63 |

OTHER PUBLICATIONS

ISO/IEC 13818–7: Information Technology—Generic coding of moving pictures and associated audio information—Part 7: Advanced Audio Coding, Technical Corrigendum 1, pp. 1–22 (Dec. 1998).

Tewfik et al., "Enhanced Wavelet Based Audio Coder," Proc. ASILOMAR Conference, IEEE (1993).

Bailey et al., "Pipelining Data Compression Algorithms," *The Computer Journal,* vol. 33, No. 4, 6pp. (Aug. 1990).

Cohn et al., "Ziv–Lempel Compressors with Deferred Innovation," in Image and Text Compression, ed. James Storer, Kluwer Academic Publishers, pp. 145–157 (1992).

Gonzalez et al., Digital Image Processing, Addison–Wesley, pp. 14, 339–359 (1993).

Howard et al., "Practical Implementations of Arithmetic Coding," in Image and Text Compression, ed. James Storer, Kluwer Academic Publishers, pp. 85–112 (1992).

Semon, "The Effects of Cascading Popular Text Compression Techniques," M.S. Thesis, East Stroudsburg University, 102 pp. (May 1993).

Stauffer et al., "Dictionary Compression on the PRAM," Technical Report 94–7, University of California, Irvine, 19 pp. (Jan. 18, 1994).

Video Coding For Low Bitrate Communication, "Line Transmission of Non–Telephone Signals," Telecommunication Standardization Sector of International Telecommunication Union, Dec. 5, 1995, pp. 22–23.

"Information Technology—Very Low Bitrate Audio–Visual Coding," Part 3: Audio, ISO/JTC1/SC29, N2203, May 15, 1998, pp. 4–9, including section on Huffman Coding.

Allen Gersho and Robert M. Gray, Vector Quantization and Signal Compression, "Entropy Coding," 1992, Chap. 9, pp. 259–305.

International Organisation for Standardisation Organisation Internationale De Normalisation, ISO/IEC JTC1/SC29/WG11, N2202, Coding of Moving Pictures and Audio, Tokyo, Mar. 1998.

Stanley N. Baron, Mark I. Krivocheev, "Coding the Audio Signal," Digital Image and Audio Communications, 1996, pp. 101–128.

Image Processing Lab, City University of Hong Kong, "Auditory Predictive Lossy Lempel–Ziv Algorithm for Speech Coding: Theory," 40 pp. [online][retrieved on Nov. 21, 2000, from http://www.image.cityu.edu.hk/stkng/].

Storer, "Massively Parallel Systolic Algorithms for Real–Time Dictionary–Based Text Compression," in Image and Text Compression, ed. James Storer, Kluwer Academic Publishers, pp. 159–178 (1992).

Williams, Ross, Adaptive Data Compression, Chapter 1, "Introductory Survey," Fluwer Academic Publishers, pp. 1–33 (1991).

* cited by examiner

400  A                8/15   Expand
402  X0=B,C           7/15

406                   2/9
408                   4/9    Keep
410                   0/9

408                   4/9    Expand
412  X1=A,C           2/9
                      3/9

414                   1/8    Keep
416                   1/8
418                   0/8
                      2/8
                      3/8

VARIABLE TO VARIABLE LENGTH ENTROPY ENCODING

FIELD OF THE INVENTION

The invention generally relates to data compression, and more specifically relates to a form of entropy coding.

BACKGROUND

In a typical audio coding environment, data is represented as a long sequence of symbols which is input to an encoder. The input data is encoded by an encoder, transmitted over a communication channel (or simply stored), and decoded by a decoder. During encoding, the input is pre-processed, sampled, converted, compressed or otherwise manipulated into a form for transmission or storage. After transmission or storage, the decoder attempts to reconstruct the original input.

Audio coding techniques can be generally categorized into two classes, namely the time-domain techniques and frequency-domain ones. Time-domain techniques, e.g., ADPCM, LPC, operate directly in the time domain while the frequency-domain techniques transform the audio signals into the frequency domain where the actual compression happens. The frequency-domain codecs can be further separated into either subband or transform coders although the distinction between the two is not always clear. Processing an audio signal in the frequency domain is motivated by both classical signal processing theories and human perception models (e.g., psychoacoustics). The inner ear, specifically the basilar membrane, behaves like a spectral analyzer and transforms the audio signal into spectral data before further neural processing proceeds.

The frequency-domain audio codecs often take advantage of many kinds of auditory masking that are going on with the human hear system to modify the original signal and eliminate a great many details/redundancies. Since the human ears are not capable of perceiving these modifications, efficient compression is achieved. Masking is usually conducted in conjunction with quantization so that quantization noise can be conveniently "masked." In modern audio coding techniques, the quantized spectral data are usually further compressed by applying entropy coding, e.g., Huffman coding.

Compression is required because a fundamental limitation of the communication model is that transmission channels usually have limited capacity or bandwidth. Consequently, it is frequently necessary to reduce the information content of input data in order to allow it to be reliably transmitted, if at all, over the communication channel. Over time, tremendous effort has been invested in developing lossless and lossy compression techniques for reducing the size of data to transmit or store. One popular lossless technique is Huffman encoding, which is a particular form of entropy encoding.

Entropy coding assigns code words to different input sequences, and stores all input sequences in a code book. The complexity of entropy encoding depends on the number m of possible values an input sequence X may take. For small m, there are few possible input combinations, and therefore the code book for the messages can be very small (e.g., only a few bits are needed to unambiguously represent all possible input sequences). For digital applications, the code alphabet is most likely a series of binary digits $\{0, 1\}$, and code word lengths are measured in bits.

If it is known that input is composed of symbols having equal probability of occurring, an optimal encoding is to use equal length code words. But, it is not typical that an input stream has equal probability of receiving any particular message. In practice, certain messages are more likely than others, and entropy encoders take advantage of this to minimize the average length of code words among expected inputs. Traditionally, however, fixed length input sequences are assigned variable length codes (or conversely, variable length sequences are assigned fixed length codes).

SUMMARY

The invention concerns using a variable-to-variable entropy encoder to code an arbitrary input stream. A variable-to-variable entropy encoder codes variable length input sequences with variable length codes. To limit code book size, entropy-type codes may be assigned to only probable inputs, and alternate codes used to identify less probable sequences.

To optimize searching the code book, it may be organized into sections that are searched separately. For example, one arrangement is to group all stored input sequences in the book according to the first symbol of the input sequence. A hash encoding function, collection of pointers, or other method may be used to immediately jump to a given section of the code book. Each section may further be sorted according to the probability associated with the entry. For example, each section may be sorted with highest probable inputs located first in the section, thus increasing the likelihood that a match will be found quickly.

Matching code cook entries depends on the internal representation of the book. For example, in a tree structure, nodes may represent each character of the input such that reaching a leaf signifies the end and identification of a particular grouping of input symbols. In a table structure, a pattern matching algorithm can be applied to each table entry within the appropriate section. Depending on the implementation of the table and matching algorithms, searching may be facilitated by recognition that only as many input symbols as the longest grouping in the code book section need to be considered. After finding a code book match, the corresponding entropy-type code can be output and the search repeated with the next symbol following the matched input.

Although the illustrated embodiments focus on encoding audio data, the input stream is expected to be any data stream, such as numbers, characters, or a binary data which encodes audio, video or other types of data. For simplicity, the input stream is referenced herein as a series of symbols, where each "symbol" refers to the appropriate measurement unit for the particular input. The input stream may originate from local storage, or from intranets, the Internet, or streaming data (e.g., Microsoft's "NETSHOW"™ client/server streaming architecture).

DETAILED DESCRIPTION

The invention has been implemented in an audio/visual codec (compressor/de-compressor). This is only one example of how the invention may be implemented. The invention is designed to be utilized wherever entropy-type coding may be utilized, and is applicable to compression of any type of data. Briefly described, optimal entropy encoding requires excessive resources, and the illustrated embodiments provide a nearly optimal encoding solution requiring far fewer resources.

Exemplary Operating Environment

Figure 1:
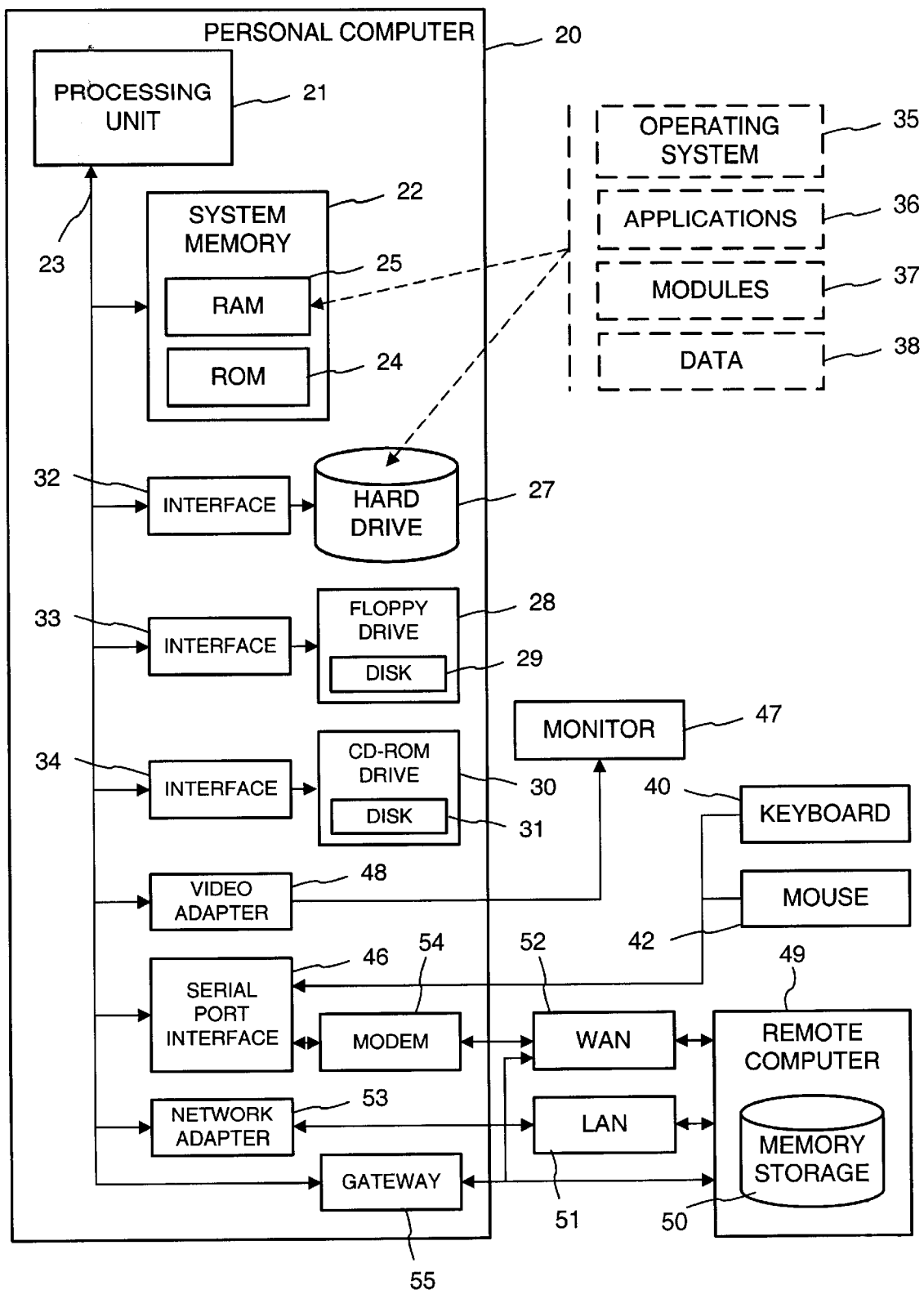
FIG. 1 is a block diagram of a computer system that may be used to implement variable to variable entropy encoding.

FIG. 1 and the following discussion are intended to provide a brief, general description of a suitable computing environment in which the invention may be implemented. While the invention will be described in the general context of computer-executable instructions of a computer program that runs on a personal computer, those skilled in the art will recognize that the invention also may be implemented in combination with other program modules. Generally, program modules include routines, programs, components, data structures, etc. that perform particular tasks or implement particular abstract data types. Moreover, those skilled in the art will appreciate that the invention may be practiced with other computer system configurations, including hand-held devices, multiprocessor systems, microprocessor-based or programmable consumer electronics, minicomputers, mainframe computers, and the like. The illustrated embodiment of the invention also is practiced in distributed computing environments where tasks are performed by remote processing devices that are linked through a communications network. But, some embodiments of the invention can be practiced on stand alone computers. In a distributed computing environment, program modules may be located in both local and remote memory storage devices.

With reference to FIG. 1, an exemplary system for implementing the invention includes a computer 20, including a processing unit 21, a system memory 22, and a system bus 23 that couples various system components including the system memory to the processing unit 21. The processing unit may be any of various commercially available processors, including Intel x86, Pentium and compatible microprocessors from Intel and others, the Alpha processor by Digital, and the PowerPC from IBM and Motorola. Dual microprocessors and other multi-processor architectures also can be used as the processing unit 21.

The system bus may be any of several types of bus structure including a memory bus or memory controller, a peripheral bus, and a local bus using any of a variety of conventional bus architectures such as PCI, AGP, VESA, Microchannel, ISA and EISA, to name a few. The system memory includes read only memory (ROM) 24 and random access memory (RAM) 25. A basic input/output system (BIOS), containing the basic routines that help to transfer information between elements within the computer 20, such as during start-up, is stored in ROM 24.

The computer 20 further includes a hard disk drive 27, a magnetic disk drive 28, e.g., to read from or write to a removable disk 29, and an optical disk drive 30, e.g., for reading a CD-ROM disk 31 or to read from or write to other optical media. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer-readable media provide nonvolatile storage of data, data structures, computer-executable instructions, etc. for the computer 20. Although the description of computer-readable media above refers to a hard disk, a removable magnetic disk and a CD, it should be appreciated by those skilled in the art that other types of media which are readable by a computer, such as magnetic cassettes, flash memory cards, digital video disks, Bernoulli cartridges, and the like, may also be used in the exemplary operating environment.

A number of program modules may be stored in the drives and RAM 25, including an operating system 35, one or more application programs (e.g., Internet browser software) 36, other program modules 37, and program data 38.

A user may enter commands and information into the computer through a keyboard 40 and pointing device, such as a mouse 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port or a universal serial bus (USB). A monitor 47 or other type of display device is also connected to the system bus 23 via an interface, such as a video adapter 48. In addition to the monitor, personal computers typically include other peripheral output devices (not shown), such as speakers and printers.

The computer 20 is expected to operate in a networked environment using logical connections to one or more remote computers, such as a remote computer 49. The remote computer 49 may be a web server, a router, a peer device or other common network node, and typically includes many or all of the elements described relative to the computer 20, although only a memory storage device 50 has been illustrated in FIG. 1. The computer 20 can contact the remote computer 49 over an Internet connection established through a Gateway 55 (e.g., a router, dedicated-line, or other network link), a modem 54 link, or by an intra-office local area network (LAN) 51 or wide area network (WAN) 52. It will be appreciated that the network connections shown are exemplary and other means of establishing a communications link between the computers may be used.

In accordance with the practices of persons skilled in the art of computer programming, the present invention is described below with reference to acts and symbolic representations of operations that are performed by the computer 20, unless indicated otherwise. Such acts and operations are sometimes referred to as being computer-executed. It will be appreciated that the acts and symbolically represented operations include the manipulation by the processing unit 21 of electrical signals representing data bits which causes a resulting transformation or reduction of the electrical signal representation, and the maintenance of data bits at memory locations in the memory system (including the system memory 22, hard drive 27, floppy disks 29, and CD-ROM 31) to thereby reconfigure or otherwise alter the computer system's operation, as well as other processing of signals. The memory locations where data bits are maintained are physical locations that have particular electrical, magnetic, or optical properties corresponding to the data bits.

Figure 2:
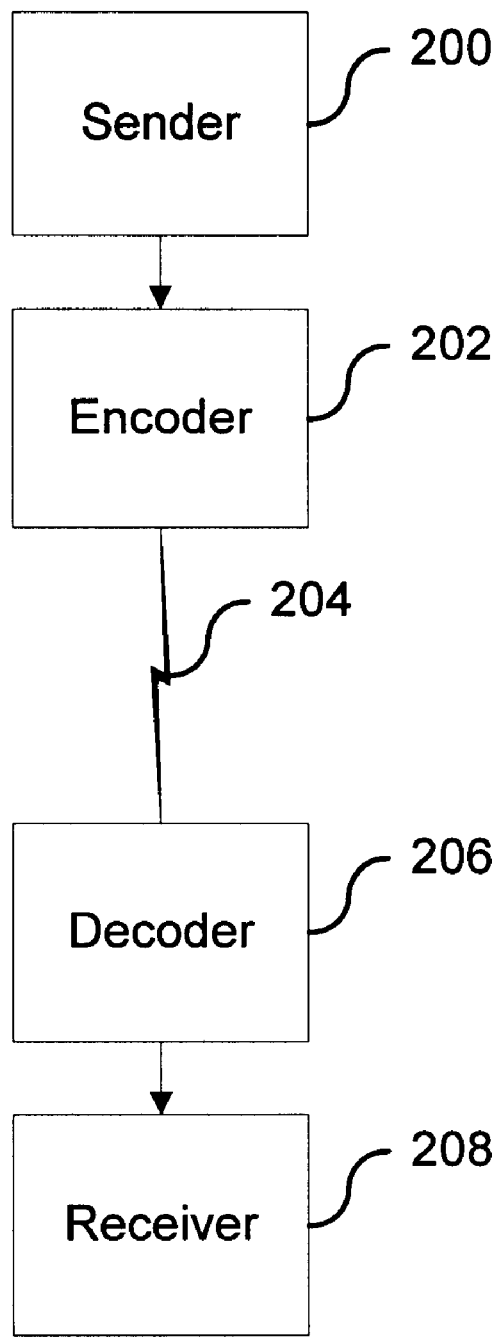
FIG. 2 shows a basic communication model for transmitting streaming and non-streaming data.

FIG. 2 shows a basic communication model. In a basic communication model, there is a data source or sender 200, a communication channel 204, and a data receiver 208. The source may be someone speaking on a telephone, over telephone wires, to another person. Or, the source may be a television or radio broadcast transmitted by wireless methods to television or radio receivers. Or, the source may be a digital encoding of some data, whether audio, visual, or other, transmitted over a wired or wireless communication link (e.g., a LAN or the Internet) to a corresponding decoder for the information.

To facilitate transmission and receipt of the data, an encoder 202 is used to prepare the data source for transmission over the communication channel 204. The encoder is responsible for converting the source data into a format appropriate for the channel 204. For example, in the context of a common telephone call, one's voice is typically converted by the phone's handset from voice sounds to analog impulses that are sent as analog data to local telephone receiving equipment. This analog signal is then converted into digital form, multiplexed with numerous other conversations similarly encoded, and transmitted over a common line towards the receiver. Thus, in FIG. 2, the channel 204 corresponds in large part to a common pathway shared by multiple senders and receivers. For network applications, the channel 204 is commonly an intranet or the Internet. At the receiving end 208, a decoder 206 is required to reverse the encoding process so as to present sensible data to the receiver.

This simple model does not take into account, however, the real-world demands of application programs. For example, a client (e.g., an application program) commonly wants to process, display or play received data in real-time as it is retrieved over a network link. To do so a streaming delivery system is required, i.e., an adaptive data transmission system that allows application-level bandwidth reservation for a data stream. Streaming environments contrast traditional networking programs, such as certain versions of Internet browsers that download web page content on a non-prioritized basis, and allow data content delivery over the network link 240 to be orchestrated (and optimized) for particular retrieval needs (such as a slow dial-up link).

An exemplary streaming format (SF) is the Microsoft Active Streaming Format. Generally, a SF defines the structure of complex, synchronized object data streams. Any object can be placed into a SF data stream, including audio and video data objects, scripts, ActiveX controls, and HTML documents. SF data can be stored in a file or created in real-time using audio and video capture hardware. An Application Programming Interface (API) corresponding to an implementation of the SF can provide an application with support for delivering and receiving streaming content. One such API is the Microsoft Audio Compression Manager (ACM), which provides functions for processing (e.g., compressing and delivering) audio data. Other networking APIs that can be used to support the SF include the Microsoft Win32 Internet Extensions (Wininet), WinSock, and TCP/IP APIs. (For more information see the 1998 Visual Studio 6.0 MSDN Library, which is incorporated herein by reference.) Note that it is intended that processed data can be stored for later retrieval by a client, and that such retrieval can be performed in a non-streaming format (e.g., by a small playback appliance).

To transmit streaming or non-streaming data, networks such as the Internet convert the source data into packet form suitable for the network. Packets generally include routing information as well as the actual data. SF data streams are preferably made up of data packets that can be transmitted over any digital network by inserting them one at a time into the data field of network packets. Each SF packet may contain a prioritized mix of data from different objects within the stream, so that the bandwidth can be concentrated on higher priority objects (or organized to optimize throughput). This data can be captured in real time, stored to nonvolatile storage, converted from existing audio or video formats, created by combining audio with pictures and scripts, or delivered over the network to a client program or viewer. The client receiver 208 of the streaming data can be a traditional "helper" application (for compatibility with the old Web publishing approach), or a more modern web page control (e.g., an ActiveX object) embedded in a web page.

SF data streams are distinguished over traditional network content as being viewed progressively in real time as a client receives it. Unfortunately, playback of streamed content becomes susceptible to transmission delays. If data does not arrive reliably, or if transmission speed falls below an acceptable minimum, playback of the content cannot continue at an acceptable rate. Smooth-streaming playback at a client requires that the transmission require a bandwidth less than the client's available bandwidth (e.g. the speed of the link 204 less networking overhead). Typically a dial-up connection to the Internet provides a bandwidth of 28–34 Kbps. Consequently, audiovisual source data (which is bandwidth intensive) must be significantly compressed to allow its transmission over low bit-rate connections. The degree of compression necessarily impacts the quality of the reproduced signal. Preferably a server provides multiple sources optimized for different networking speeds, or utilizes an adaptive feedback system to perform real-time analysis of the client's actual throughput.

Once SF data packets are encoded 202 and placed inside network packets and sent over the network 204, the routing technology of the network takes care of delivering the network packets to the receiver 208. Preferably a variety of network and application protocols, such as UDP, TCP, RTP, IP Multicast, IPX, and HTTP, are supported by the broadcast sender 200.

As discussed above, bandwidth is limited and the encoder 202 generally must compress data prior to transmission. A particularly effective method for encoding source data frequency coefficients to ensure reliable transmission over a communication channel is entropy encoding. Entropy coding capitalizes on data coherency, and is effective when symbols have non-uniform probability distribution.

Figure 3:
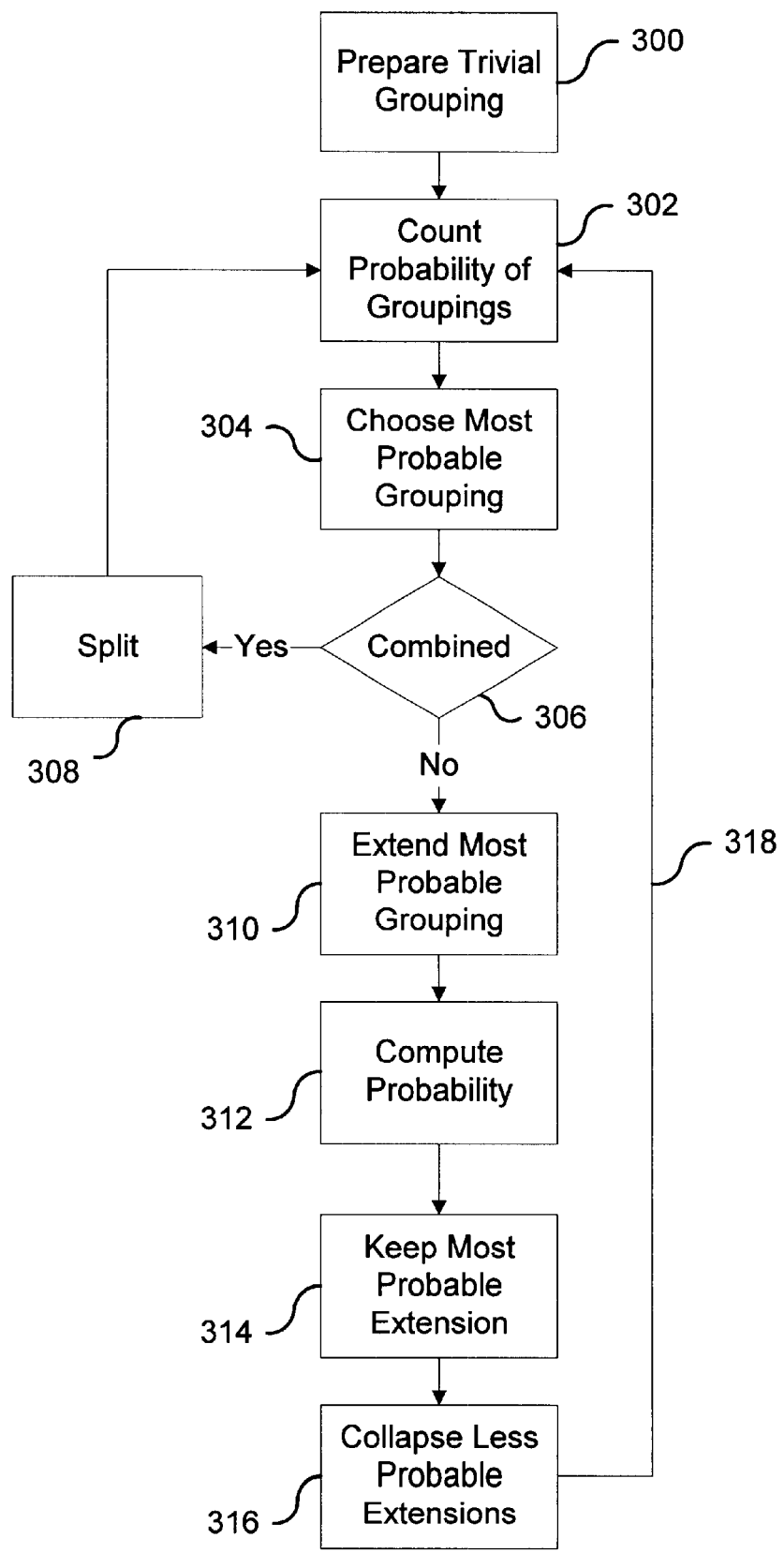
FIG. 3 is a flowchart showing creation of a code book having variable length entries for variable length symbol groupings.

FIG. 3 is a flowchart showing a preferred method for generating an entropy encoder's code book. In particular, in contrast with prior art techniques, FIG. 3 illustrates how to create a code book having variable length code assignments for variable length symbol groupings. As discussed above, prior art techniques either require fixed-length codes or fixed blocks of input. Preferred implementations overcome the resource requirements of large dimension vector encoding, and the inapplicability of coding into words of equal lengths, by providing an entropy based variable-to-variable code, where variable length code words are used to encode variable length X sequences.

Let $y_i$ represent each source symbol group $\{x_j\}$, for 1 j $N_i$, having probability $P_i$ of occurring within the input stream (FIG. 2 channel 204), and that each group is assigned a corresponding code word having $L_i$ bits. It is presumed that each $x_j$ is drawn from a fixed alphabet of predetermined size. The objective is to minimize the equation $$L = \sum_i \frac{L_i * P_i}{N_i}.$$

Instead of finding a general solution to the problem, the problem is separated into two different tasks. The first task is identification of a (sub-optimal) grouping of a set of input symbols $\{x_i\}$ through an empirical approach described below. The second task is assigning a entropy-type code for the grouped symbols $\{y_i\}$. Note that it is known that if the source is not coherent (i.e., the input is independent or without memory), any grouping that has the same configuration of $\{N_j\}$ can achieve the same coding efficiency. In this situation, the first task becomes inconsequential.

To perform the first task, an initial trivial symbol grouping 300 is prepared, such as $\{y_i\}=\{x_i\}$. This initial configuration assumes that an exemplary input stream is being used to train creation of the code book. It is understood that a computer may be programmed with software constructions such as data structures to track receipt of each symbol from an input. Such data structures may be implemented as a binary-type tree structure, hash table, or some combination of the two. Other equivalent structures may also be used.

After determining the trivial grouping, the probability of occurrence for each $y_i$ is computed 302. Such probability is determined with respect to any exemplary input used to train code book generation. As further symbols are added to the symbol data structure, the probabilities are dynamically adjusted.

Next, the most probable grouping $y_i$ is identified 304 (denoted as $y_{mp}$). If 306 the highest probability symbol is a grouping of previously lower probability symbols, then the grouping is split 308 into its constituent symbols, and processing restarted from step 302. (Although symbols may be combined, the group retains memory of all symbols therein so that symbols can be extracted.)

If the symbol is not a grouping, then processing continues with step 310, in which the most probable grouping is then tentatively extended 310 with single symbol extensions $x_i$'s. Preferably $y_{mp}$ is extended with each symbol from the X alphabet is used. However, a predictor can be used to only generate an extension set containing only probable extensions, if the alphabet is very large and it is known many extensions are unlikely. For example, such a predictor may be based on semantic or contextual meaning, so that very improbable extensions can be ignored a priori.

The probability for each tentative expansion of $y_{mp}$ is then computed 312, and only the most probable extension retained 314. The rest of the lower probability extensions are collapsed together 316 as a combined grouping and stored in code book with a special symbol to indicate a combined grouping. This wild-card symbol represents any arbitrary symbol grouping having $y_{mp}$ as a prefix, but with an extension (suffix) different from the most probable extension. That is, if $y_{mp}+x_{mp}$ is the most probable root and extension, then the other less probable extensions are represented as $y_{mp}^*$, * $x_{mp}$. (Note that this discussion presumes, for clarity, serial processing of single-symbol extensions; however, parallel execution of multiple symbol extensions is contemplated.)

It is understood by one skilled in the art that applying single symbol extensions, and keeping only one most probable grouping, are restrictions imposed for clarity of discussion. It is further understood that although discussion focuses on serial processing, code book construction may be paralleled.

Code book construction is completed by repeating 318 steps 302–316 until all extensions have been made, or the number of the code book entries reaches a predetermined limit. That is, repeating computing probabilities for each current $y_i$ 302, where the code book set $\{Y\}$ now includes $y_{mp}+x_{mp}$, and respectively choosing 304 and grouping the most and least likely extensions. The effect of repeatedly applying the above operations is to automatically collect symbol groupings having high correlation, so that intergroup correlation is minimized. This minimizes the numerator of L, while simultaneously maximizing the length of the most probable $y_i$ so that the denominator of L is maximized.

FIGS. 4–10 illustrate creation of a code book pursuant to FIG. 3 for an alphabet $\{A, B, C\}$. For this discussion, the code book is defined with respect to an exemplary input stream "A A A B B A A C A B A B B A B". As discussed above, one or more exemplary inputs may be used to generate a code book that is then used by encoders and decoders to process arbitrary inputs. For clarity, the code book is presented as a tree structure, although it may in fact be implemented as a linear table, hash table, database, etc. As illustrated, the tree is oriented left-to-right, where the left column (e.g., "A" and "X0") represents the top row of a tree-type structure, and successively indented rows represent the "children" of the previous row's node (e.g., in a top-down tree for FIG. 5, node "A" is a first-row parent node for a second-row middle-child node "B".).

In preparing the code cook, the general rule is to pick the most probable leaf node, expand it, re-compute probabilities to determine the most probable leaf-node, and then compact the remaining sibling nodes into a single Xn node (n=0 . . . N, tracking each time nodes have been combined). If it turns out that the most probable node is a group node, then the group is split, probabilities recalculated, and the most probable member node retained (i.e., the remaining group members are re-grouped). Processing cycles until a stop state is reached, such as a code book having predetermined size.

Figure 4:
FIGS. 4–10 illustrate creation of a code book pursuant to FIG. 3 for an alphabet $\{A, B, C\}$.

FIG. 4 shows an initial grouping for the input stream "A AA B B A A C A B A B B A B". An initial parsing of the input shows probabilities of occurrence of A=8/15, B=6/15, and C=1/15. This initial trivial grouping can be created based on different criteria, the simplest being having a first-level node for every character in the alphabet. However, if the input alphabet is large, the trivial grouping may be limited to some subset of symbols having highest probability, where the remaining symbols are combined into an X grouping. FIG. 4 illustrates this technique by starting with only two initial groups, group A 400 having probability 8/15, and group X0 402 having probability 7/15, where X0 represents all remaining low probability symbols in the alphabet, e.g., B and C.

Figure 5:
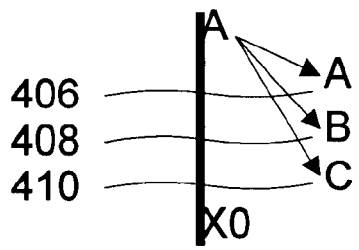

After preparing an initial trivial grouping, the leaf-node having highest probability is selected for extension (see also FIG. 3 discussion regarding processing sequence). Hence, as shown in FIG. 5, group A 400 is tentatively expanded by each character in the alphabet (or one may limit the expansion to some subset thereof as described for creating the initial grouping). Probabilities are then recomputed with respect to the input stream "A A A B B A A C A B A B B A B" to determine values for the tentative extensions A 406, B 408, and C 410. The result is nine parsing groups, where "A A" appears 2/9, "A B" appears 4/9, and "A C" appears 0/9. Therefore, the most probable extension "a b" is retained and the other extensions collapsed into X1=A,C. Note that although this discussion repeatedly recalculates all probabilities, a more efficient approach is to retain probabilities and symbol associations for each node within the node, and only computing information as necessary.

Figure 6:
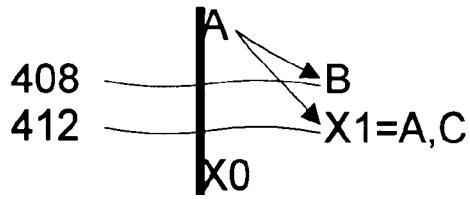

FIG. 6 shows the collapse into X1 for FIG. 5. Processing repeats with identification of the node having highest probability, e.g., node B 408 at probability 4/9.

Figure 7:
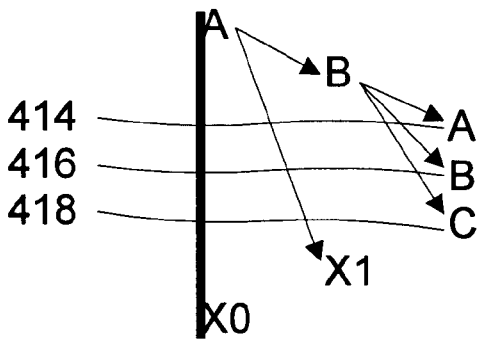

As shown in FIG. 7, this node 408 is tentatively extended with symbols A 414, B 416, C 418, and as discussed above, the tentative grouping with highest probability is retained. After recalculating probabilities, the result is eight parsing groups in which the symbol sequence "A B A" 414 appears once, "A B B" 416 appears once, and "A B C" 418 does not appear at all. Since tentative extensions A 414 and B 416 have the same probability of occurrence, a rule needs to be defined to choose which symbol to retain. For this discussion, whenever there are equal probabilities, the highest row node (e.g., the left-most child node in a top-down tree) is retained. Similarly, when there is a conflict between tree rows, the left-most row's node (e.g., the node closest to the root of a top-down tree) is retained.

Note that the above described parsing of the exemplary input does not account for the trailing two symbols "A B" of the input. As illustrated in FIG. 7, there is no leaf corresponding to "A B" as that configuration was expanded into "A B A", "A B B", and "A B C". To compensate, code book entries can be created to account for such end of input sequences, or the input having no entry can be escaped with a special character and inserted in the encoded output stream. For example, a special symbol can be used to indicate end of input, therefore implying how to handle the trailing characters on decoding.

Figure 8:
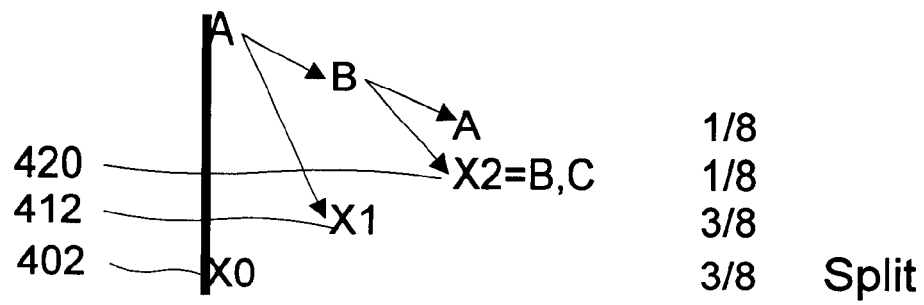

Therefore, as shown in FIG. 8, node A 414 is retained and nodes B 416 and C 418 are combined into node X2=B,C 420, having combined probability of 1/8+0/8. Now, the next step is to expand the node currently having highest probability with respect to the input stream. As shown, nodes X1=A,C 412 and X0=B,C 402 have the same probability of occurrence (3/8). As discussed above, the highest node in the tree (X0 402) is extended. (Although it is only necessary to be consistent, it is preferable to expand higher level nodes since this may increase coding efficiency by increasing the number of long code words.)

Figure 9:
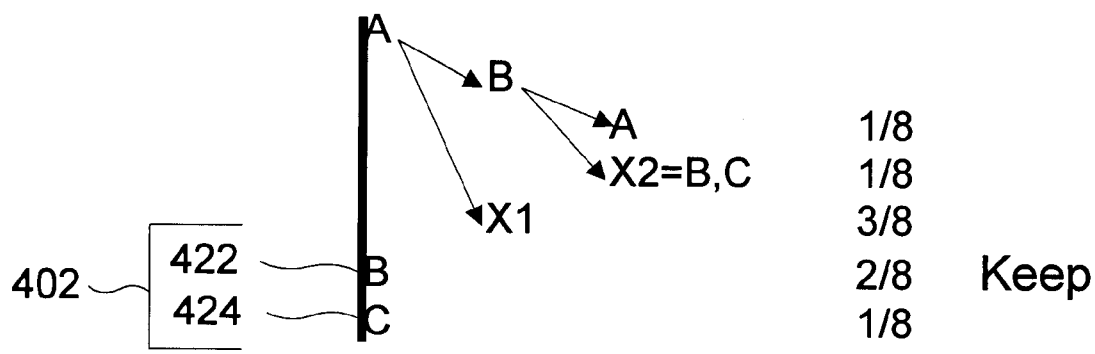

However, X0 402 is a combined node, so it must be split instead of extended. FIG. 9 illustrates the result of splitting node X0 into its constituent symbols B 422 and C 424. Recalculating probabilities indicates that symbol sequences "A B A" appears 1/8, "A B X2" appears 1/8, "A X1" appears 3/8, "B" 422 appears 2/8, and "C" appears 1/8. Since this is a split operation, the split node having highest probability, e.g, node B 422, is retained, and the remaining node(s) re-combined back into X0=C 424.

Figure 10:
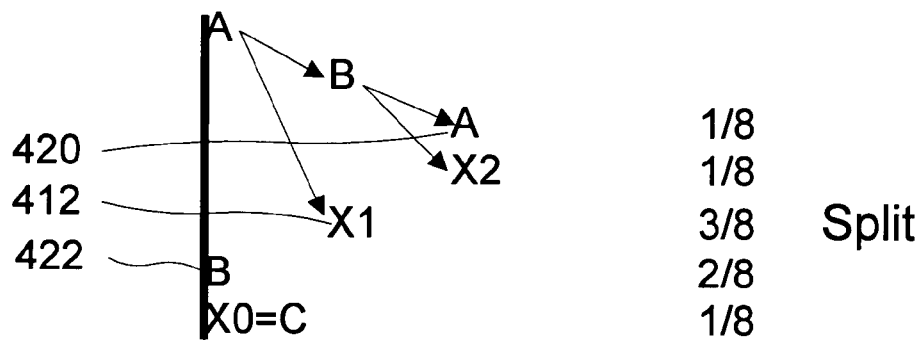

FIG. 10 shows the result of retaining high-probability node B 422. Note that grouping X0 now only represents a single symbol "C". After revising probabilities, the node having highest probability must be identified and split or extended. As shown, symbol sequence "A B A" appears 1/8, "A B X2" appears 1/8, "A X1" appears 3/8, "B" appears 2/8, and "X0" appears 1/8. Therefore node X1 412, as a combined node, must be split.

Splitting proceeds as discussed above, and processing the code book cycles as illustrated in FIG. 3, with highest probability nodes being extended or split until a stop state is reached (e.g., the code book reaches a maximum size). Once the code book has reached a stop state, it is available for encoding data to transmit over a communication channel. Note that for the FIG. 10 configuration, the average bits per input symbol, assuming fractional bits under "ideal" scalar Huffman encoding, is approximately 0.8 bits/symbol (varies depending on how the trailing input "A B" is handled). This represents a significant (about 10%) savings over previous lossless compression techniques.

Figure 11:
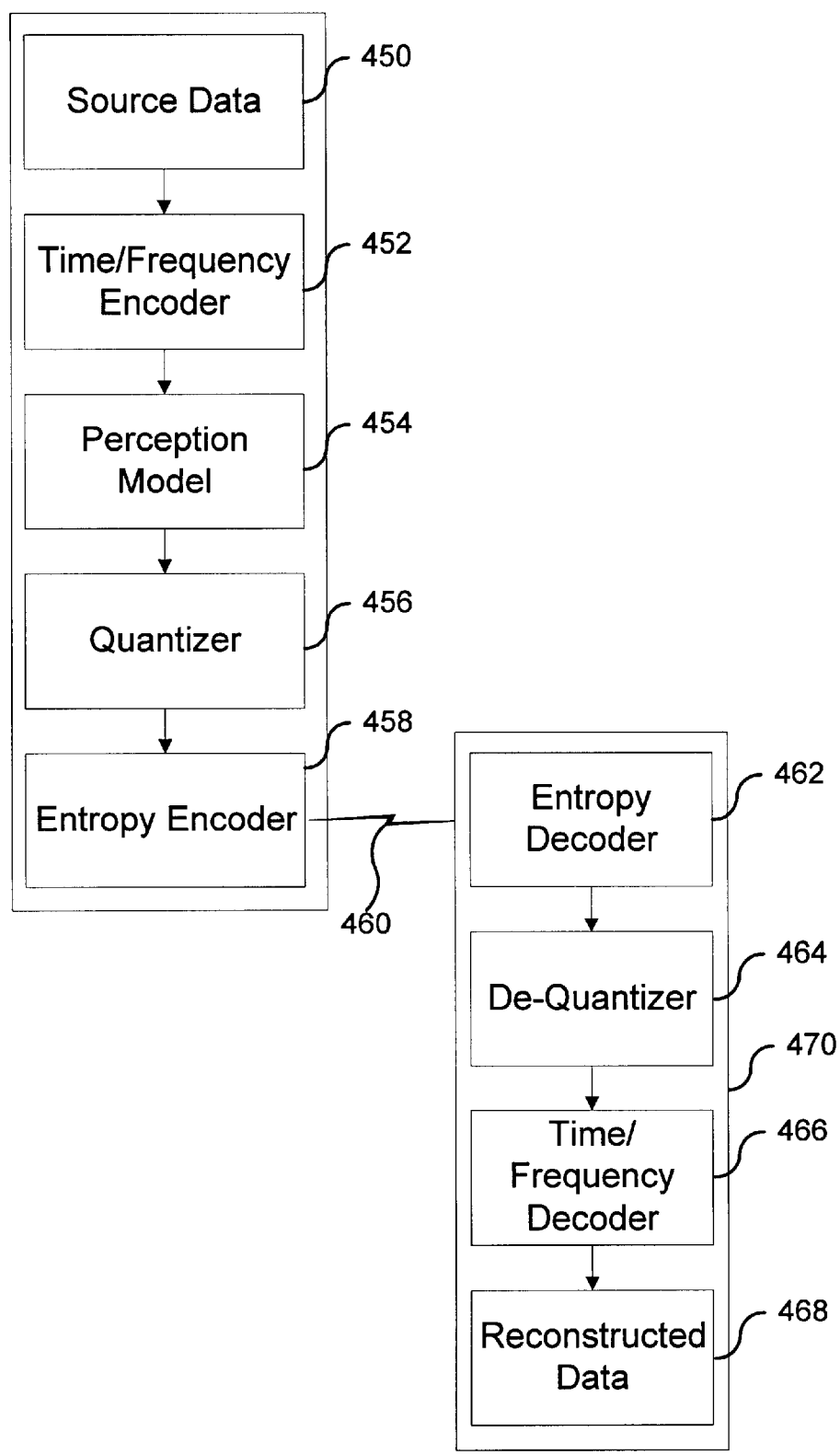
FIG. 11 shows encoding of audio data.

FIG. 11 shows a transmission model for transmitting audio data over a channel 460. It is presumed that the channel 460 is of limited bandwidth, and therefore some compression of source data 450 is required before the data can be reliably sent. Note that although this discussion focuses on transmission of audio data, the invention applies to transfer of other data, such as audio visual information having embedded audio data (e.g., multiplexed within an MPEG data stream), or other data sources having compressible data patterns (e.g., coherent data).

As illustrated, source data 450 is input to a time/frequency transform encoder 352 such as a filter bank or discrete-cosine type transform. Transform encoder 452 is designed so as to convert a continuous or sampled time-domain input, such as an audio data source, into multiple frequency bands of predetermined (although perhaps differing) bandwidth. These bands can then be analyzed with respect to a human auditory perception model 454 (for example, a psychoacoustic model) in order to determine components of the signal that may be safely reduced without audible impact. For example, it is well known that certain frequencies are inaudible when certain other sounds or frequencies are present in the input signal (simultaneous masking). Consequently, such inaudible signals can be safely removed from the input signal. Use of human auditory models is well known, e.g., the MPEG 1, 2 and 4 standards. (Note that such models may be combined into a quantization 456 operation.)

After performing the time/frequency transformation, frequency coefficients within each range are quantized 456 to convert each coefficient (amplitude levels) to a value taken from a finite set of possible values, where each value has a size based on the bits allocated to representing the frequency range. The quantizer may be a conventional uniform or non-uniform quantizer, such as a midriser or midtreader quantizer with (or without) memory. The general quantization goal is identifying an optimum bit allocation for representing the input signal data, i.e., to distribute usage of available encoding bits to ensure encoding the (acoustically) significant portions of the source data. Various quantization methods, such as quantization step size prediction to meet a desired bit rate (assuming constant bit rate) can be used. After the source 450 has been quantized 456, the resultant data is then entropy encoded 460 according to the code book of FIG. 3.

Figure 12:
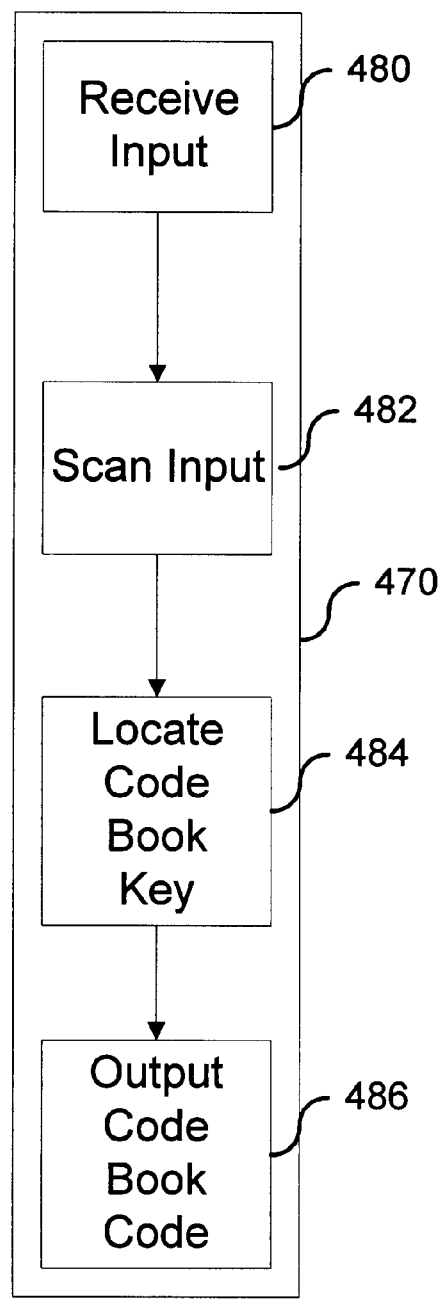
FIG. 12 illustrates an entropy encoder.

FIG. 12 shows one method for implementing the entropy encoder 458 of FIG. 11 through application of the code book of FIG. 3 to the quantized data. The code book for variable-to-variable encoding can be used to encode other types of data. As illustrated, the quantized data is received 480 as input to the entropy encoder 458 of FIG. 11. It is understood that the input is in some form of discrete signals or data packets, and that for simplicity of discussion, all input is simply assumed to be a long series of discrete symbols. The received input 480 is scanned 482 in order to locate 484 a corresponding code book key in the code book of FIG. 3. Such scanning corresponds to a data look-up, and depending on how the data structure used to implement the code book, the exact method of look-up will vary.

There are various techniques available for storing and manipulating the code book. One structure for a code book is traversal and storage of a N-ary,(e.g., binary, tertiary, etc.) tree, where symbol groupings guide a traversal of the tree structure. The path to a leaf node of the tree represents the end of a recognized symbol sequence, where a entropy-type code is associated with the sequence. (Note that the code cook may be implemented as a table, where a table entry contains the entire input sequence, e.g., the path to the node.) Nodes can be coded in software as a structure, class definition, or other structure allowing storage of a symbol or symbols associated with the node, and association of a corresponding entropy-type code 486.

Alternatively, the code book may be structured as a table having each string of input symbol sorted by probability of occurrence, with highly probable input at the top of the table. For large tables, the table can be sorted according to the first symbol, i.e., all symbol series beginning with "A" are grouped together, followed by series starting with "B", etc. With this arrangement, all entries within the grouping are sorted according to their probabilities of occurrence. The position of the beginning of each section is marked/tracked so that a hash-type function (e.g., a look-up based on the first symbol) can be used to locate the correct portion of the code book table. In this look-up table approach to storing the code book, once the first symbol is hashed, then the corresponding table section is exhaustively searched until a matching entry is located. The code 484 associated with the matching entry is then output 486 as the encoded substitute.

Continuing now with FIG. 11, once the output 486 is known, this output is transmitted over the communication channel 460. The receiving end 470 then implements a reverse-encoding process, i.e., a series of steps to undo the encoding of the source data 450. That is, the encoded data 486 is received as input to an entropy decoder 462 which performs a reverse code book look-up to convert the encoded output 486 back into the original input symbol series 480 (FIG. 12). The recovered input data 480 is then processed by a de-quantizer 464 and time/frequency transform decoder 466 to reverse the original coding operations, resulting in a reconstructed data 468 that is similar to the original source data 450. It should be noted that the reconstructed data 468 only approximates the original source data 450 when, as it presumed herein, a lossy system is employed.

Having described and illustrated the principles of my invention with reference to an illustrated embodiment, it will be recognized that the illustrated embodiment can be modified in arrangement and detail without departing from such principles. Accordingly, what is claimed as the invention is all such modifications as may come within the scope and spirit of the following claims and equivalents thereto.

What is claimed is:

1. A method of encoding a sequence of digital audio data symbols from an input channel, comprising:
    identifying a first variable size grouping of audio data symbols within the sequence of digital audio data symbols;
    coding the first variable size grouping of symbols with a coding arrangement which produces as output an entropy code word corresponding to the first grouping of symbols, wherein the coding utilizes a pre-constructed code book that associates variable size groupings of audio data symbols with corresponding entropy code words for variable-to-variable compression; and
    repeatedly identifying and coding subsequent variable size groupings of symbols such that at least two identified groupings of symbols within the sequence of digital audio data symbols have differing sizes.

2. A method according to claim 1, in which the code book is organized into sections according to a first symbol of each grouping in the code book, where each section is further sorted by probability of occurrence of each entry within each section, and wherein identifying a variable size grouping comprises:
    identifying a section by a first symbol of the variable size grouping; and
    matching the variable size grouping against each section entry until a match is found.

3. A method according to claim 2, wherein the match has a size, such size indicating a new position in the sequence of digital audio data symbols for identifying a second variable size grouping of symbols.

4. A method according to claim 3, wherein the first and the second variable size grouping have differing sizes.

5. A method according to claim 1, wherein the input channel is a network connection.

6. A method according to claim 5, wherein the network connection is to the Internet, and a streaming networking protocol is utilized to communicate over the network connection.

7. A method according to claim 1, in which the method of encoding the sequence of digital data symbols is performed by an application program implementing the Hyper-Text Markup Language protocol.

8. A method according to claim 1, wherein the input channel is in communication with a disk storage, the method further comprising the step of reading the sequence of digital data symbols from the disk storage, so as to allow identification and coding of the variable size grouping of symbols.

9. A method according to claim 1, in which the method of encoding the sequence of digital data symbols is performed by an application program implementing the File Transfer Protocol.

10. A method according to claim 1, in which the input channel is in communication with a computer-readable non-volatile data storage.

11. A method according to claim 1;
    wherein the code book is organized as a table having sections, such sections defined by a first symbol of each variable size grouping of symbols, and
    wherein table entries within a section are sorted according to probability of occurrence of each variable size grouping of symbols within the section.

12. A computer readable medium having stored therein computer programming code for causing a computer to perform the method of claim 1.

13. A method for decoding a compressed audio data stream, comprising:
    receiving an entropy code word;
    looking up the entropy code word in a pre-constructed code book containing a correspondence between entropy code words and variable size series of symbols for variable-to-variable decompression; and
    outputting a variable size series of audio data symbols corresponding to the code word in the code book.

14. The method of claim 13, wherein the step of looking up the entropy code word includes hash encoding the entropy code word to obtain an index to an entry in a hash table.

15. The method of claim 14, wherein the code book is organized into sections according to a first symbol of each variable size series of symbols stored within the code book.

16. A computer readable medium having stored therein computer programming code for causing a computer to perform the method of claim 13.

17. A method for receiving broadcast audiovisual data from an input and converting the broadcast audiovisual data into compressed form for sending over a transmission output, comprising:
    receiving the broadcast audiovisual data from the input;
    sampling the broadcast audiovisual data into a discrete series of symbols representative of audiovisual data in the broadcast;
    identifying a variable size grouping of symbols within the discrete series of symbols;

looking up in a pre-constructed code book an entropy code word corresponding to the variable size grouping of symbols, wherein the code book associates groupings of symbols with corresponding entropy code words for variable-to-variable compression; and transmitting the code word over the transmission output;

wherein the broadcast audiovisual data is compressed by successive replacement of variable size groupings of symbols with code words.

18. A method according to claim 17, wherein the broadcast is received in real-time, and the step of transmitting the code word is performed in real-time.

19. A method according to claim 18, further comprising the step of receiving a connection request from a client over a client network connection, wherein the step of transmitting the code word is performed by transmission over the client network connection.

20. A method according to claim 19, wherein the broadcast is received and stored in non-volatile storage, and transmission is delayed until receipt of the connection request from the client.

21. A method according to claim 20, in which the broadcast is stored in the non-volatile storage in compressed form as a series of code words, such code words being transmitted to the client upon receiving the client connection request.

22. A computer readable medium having stored therein computer programming code for causing a computer to perform the method of claim 17.

23. A system for transmitting a compressed audiovisual data stream from a server network service to a client network service over a network link, such compressed audiovisual data stream formed by replacing a variable size sequence of audiovisual data input symbols with an output entropy code, comprising:

an input buffer for storing a series of uncompressed audiovisual data symbols to compress and transmit to the client;

an output memory for storing an entropy code word representing a compressed version of the series of uncompressed symbols in the input buffer;

a code book memory for storing a pre-existing code book containing an entropy code word for a variable size series of symbols, wherein the code book associates variable size series of symbols with corresponding entropy code words for variable-to-variable compression;

a searching arrangement for looking up a code word for a particular series of symbols in the code book; and an encoding arrangement having an input in communication with the input buffer and an output in communication with the output memory;

wherein the encoding arrangement applies the searching arrangement to look up the code word for the series of uncompressed symbols for storage in the output memory.

24. A system according to claim 23, further comprising transmission means for transmitting the contents of the output memory to the client over the network link.

25. A system for decoding compressed audiovisual data received from a network link, the method comprising:

an input memory for storing a code word;

an output buffer for storing a series of uncompressed audiovisual data symbols corresponding to the code word in the input memory;

a code book memory for storing a pre-existing code book containing a variable size series of symbols for an entropy code word, wherein the code book associates entropy code words with corresponding variable size series of symbols for variable-to-variable decompression;

a searching arrangement for looking up a code word for a particular series of symbols in the code book; and a decoding arrangement having an input in communication with the input memory and an output in communication with the output buffer;

wherein the decoding arrangement applies the searching arrangement to look up the series of uncompressed symbols corresponding to the code word, and store such series in the output buffer.

* * * * *